(12) United States Patent
Wang

(10) Patent No.: US 11,133,820 B1
(45) Date of Patent: Sep. 28, 2021

(54) OVERLOAD RECOVERY METHOD IN SIGMA DELTA MODULATORS

(71) Applicant: TEXAS INSTRUMENTS INCORPORATED, Dallas, TX (US)

(72) Inventor: Binan Wang, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/829,037

(22) Filed: Mar. 25, 2020

(51) Int. Cl.
*H03M 3/00* (2006.01)

(52) U.S. Cl.
CPC .......... *H03M 3/364* (2013.01); *H03M 3/464* (2013.01); *H03M 3/498* (2013.01)

(58) Field of Classification Search
CPC ....... H03M 3/364; H03M 3/464; H03M 3/498
USPC ................. 343/143, 144, 155, 172
See application file for complete search history.

(56) References Cited

U.S. PATENT DOCUMENTS

| | | | |
|---|---|---|---|
| 6,061,009 A | 5/2000 | Krone et al. | |
| 6,157,329 A * | 12/2000 | Lee | H03M 3/408 341/133 |
| 6,362,763 B1 | 3/2002 | Wang | |
| 6,765,520 B1 | 7/2004 | Chuang et al. | |
| 7,215,270 B1 * | 5/2007 | Kozak | H03M 3/498 341/143 |
| 7,902,916 B2 * | 3/2011 | Jeong | H03F 3/005 327/554 |
| 8,681,030 B1 * | 3/2014 | Huynh | H01L 23/645 341/143 |

* cited by examiner

*Primary Examiner* — Peguy Jean Pierre
(74) *Attorney, Agent, or Firm* — John R. Pessetto; Charles A. Brill; Frank D. Cimino

(57) ABSTRACT

A delta sigma modulator includes two adders, an integrator stage, a reconfigurable local resonator, an analog-to-digital converter (ADC), and a digital-to-analog converter (DAC). A first adder receives an analog input signal at an additive input, and the integrator stage receives an output from the first adder and generates an integrated signal. The reconfigurable local resonator receives the integrated signal and generates a resonator output signal. A second adder receives the resonator output signal, the integrated signal, and the input signal. The ADC receives an output from the second adder and generates a digital output signal which can be provided to other circuits. The DAC receives the digital output signal, and generates and provides a feedback signal to a subtractive input of the first adder. The reconfigurable local resonator acts as a resonator, but reconfigures to act as a low pass filter in response to overload conditions.

20 Claims, 6 Drawing Sheets

OVERLOAD RECOVERY METHOD IN SIGMA DELTA MODULATORS

BACKGROUND

Delta sigma modulators are commonly used for analog-to-digital signal conversion of signals. Higher order delta sigma modulators include three or more integrator stages in cascade, and can reduce quantization noise. However, higher order delta sigma modulators can become unstable in response to overload conditions, such as the amplitude of an input signal increasing above a predetermined threshold. An unstable delta sigma modulator can cause integrator outputs to saturate and the delta sigma modulator output signal to oscillate.

Many delta sigma modulators include detection and recovery circuits to monitor for overload conditions and help return the modulators to operation after the overload condition is removed. However, many recovery methods are process and temperature dependent and cannot be adapted to different signal voltages. In addition, some recovery methods are disruptive such that the modulator output signal is not usable, and some recovery methods require additional circuitry such as jamming digital filters or switched capacitor branches which occupy additional area on the semiconductor die and increase the component cost of the modulator.

SUMMARY

A reconfigurable local resonator includes an adder, two integrator stages, a T-shaped cell of capacitors, and a switching stage. A first integrator stage is coupled to an output of the adder, and a second integrator stage is coupled to an output of the first integrator stage. The T-shaped cell of capacitors includes a first capacitor coupled to an input of the first integrator stage, a second capacitor coupled to the first capacitor, and a third capacitor coupled to the first and second capacitors. The switching stage is coupled to the second capacitor and to an output of the second integrator stage. The output of the second integrator stage is further coupled to a subtractive input of the adder.

The first integrator stage comprises a switched capacitor network and an integrator having an input coupled to an output of the switched capacitor network and a fourth capacitor, and having an output of the first integrator stage. The first capacitor is coupled to the switched capacitor network. The second integrator stage comprises a switched capacitor network and an integrator having an input coupled to an output of the switched capacitor network and a fourth capacitor, and having the output of the second integrator stage. The third capacitor in the T-shaped cell of capacitors is configured to be coupled to the input of the integrator in the second integrator stage in response to overload conditions.

In some implementations, the third capacitor comprises a fifth capacitor, a sixth capacitor, and a seventh capacitor coupled together in parallel. In response to overload conditions, the fifth capacitor is coupled to the input of the integrator in the second integrator stage. In some implementations, in response to overload conditions the sixth capacitor is coupled in parallel with the first capacitor, and the seventh capacitor is coupled in parallel with the second capacitor. In some implementations, the reconfigurable resonator is included in a delta sigma modulator.

BRIEF DESCRIPTION OF THE DRAWINGS

For a detailed description of various examples, reference will now be made to the accompanying drawings in which.

DETAILED DESCRIPTION

In the disclosed reconfigurable local resonators, two integrator stages are coupled together and a T-shaped cell of three capacitors and a switching stage are coupled between an input of the first integrator stage and the output of the second integrator stage. The desired feedback coefficient from the resonator is very small, often too small to be realizable by a single capacitor. A T-shaped cell of capacitors comprises, for example, three capacitors. One terminal of each of the three capacitors are coupled together at a shared node. The other terminal of each capacitor is coupled to another portion of the circuit. The T-shaped cell of capacitors offers a reliable way to implement a small feedback coefficient by effectively reducing the feedback charge. The T-shaped cell of capacitors can be reconfigured in response to overload conditions to convert the local resonator into a low pass filter. A first capacitor in the T-shaped cell is coupled to the input of the first integrator stage, and a second capacitor in the T-shaped cell is coupled to the first capacitor and to the switching stage. A third capacitor in the T-shaped cell is coupled to a common mode voltage and can be coupled to an input of the second integrator stage in response to overload conditions.

In some implementations, the third capacitor that is reconfigured between the T-shaped cell and the second integrator stage comprises a fourth, a fifth, and a sixth capacitor coupled together in parallel during operation as a local resonator. In response to overload conditions and operating as a low pass filter, one or more of the fourth, fifth, and sixth capacitors are coupled to the input of the second integrator stage. In one implementation, the fourth capacitor is coupled to the input of the second integrator stage while the fifth capacitor is coupled in parallel with the first capacitor, and the sixth capacitor is coupled in parallel with the second capacitor.

Figure 1:
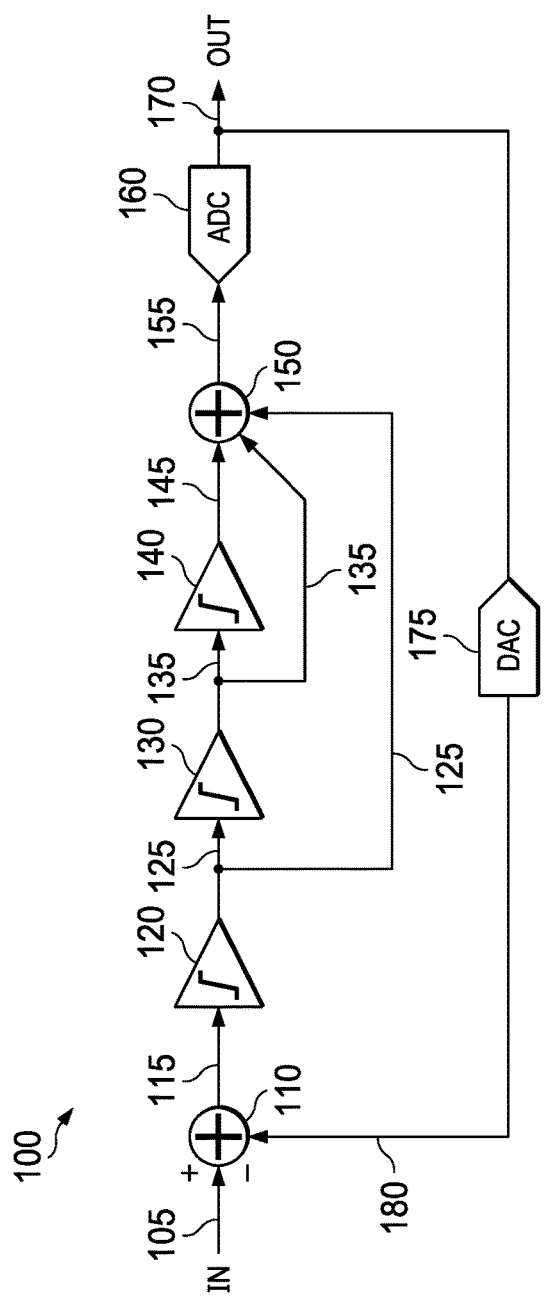
FIG. 1 shows a block diagram of an example higher order delta sigma modulator circuit.

FIG. 1 shows a block diagram of an example higher order delta sigma modulator circuit 100. An input signal IN 105 is input to integrator 120 through adder 110. The output 125 of integrator 120 is input to adder 150 and integrator 130. The output 135 of integrator 130 is provided to adder 150 and integrator 140. The output 145 of integrator 140 is provided to adder 150, which adds the output signals 125, 135, and 145 together to obtain the summed signal 155. The analog-to-digital converter (ADC) 160, sometimes referred to as an internal quantizer, converts the analog summed signal 155 into a digital output signal OUT 170, which is provided to other circuits for use and to digital-to-analog converter (DAC) 175. DAC 175 converts the digital signal OUT 170 into an analog output signal 180, which is provided to adder 110 in a feedback loop for subtraction from IN 105.

Delta sigma modulator 100 is a third order modulator due to the three integrator stages 120, 130, and 140 arranged in cascade. Modulators with an order of three or greater are generally considered high order modulators. Higher order delta sigma modulators can become unstable under certain operating conditions, such as in response to overload conditions like the amplitude of IN 105 increasing above a predetermined threshold. An unstable delta sigma modulator can cause integrator outputs to saturate and the modulator output signal OUT 170 to oscillate. This condition can persist even after the overload conditions are removed from delta sigma modulator 100. To counter this effect, many delta sigma modulators include a detection and recovery circuit to monitor for overload conditions and reset the integrators or manage their outputs within a certain level, which helps returns the delta sigma modulator to operation after the overload condition is removed.

Figure 2:
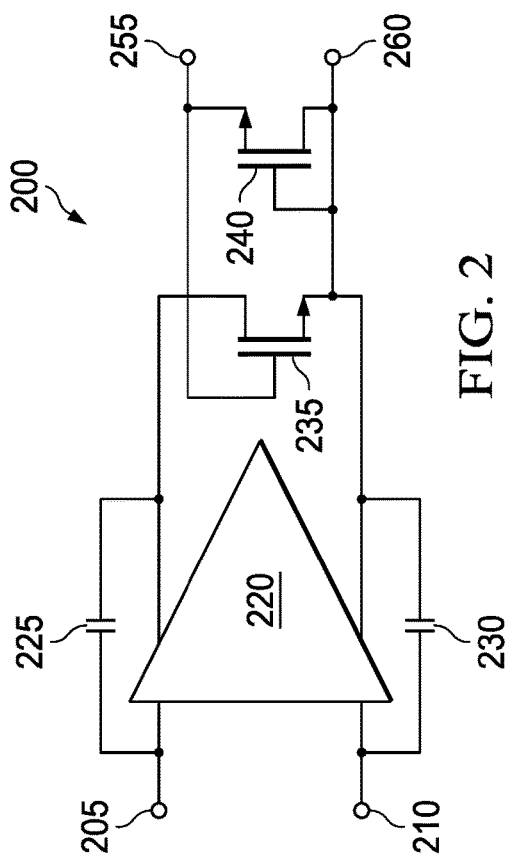
FIG. 2 illustrates example integrator stage with diodes across the integrator outputs for use in a delta sigma modulator circuit.

FIG. 2 illustrates example integrator stage 200 with diodes across the integrator outputs for use in a delta sigma modulator circuit. Integrator stage 200 includes an integrator 220 with inputs 205 and 210 and outputs 255 and 260. Capacitor 225 is coupled between input 205 and output 255, and capacitor 230 is coupled between input 210 and output 260. Transistors 235 and 240 are configured as diodes and placed back to back across outputs 255 and 260, which limits the integrator output signal to be no greater than the threshold voltage of transistors 235 and 240 in response to overload conditions. However, the threshold voltage of transistors 235 and 240 is process dependent, and can vary based on temperature, supply voltage, and the like. Variation in the threshold voltage can change how the integrator stage 200 responds to overload conditions and may not clamp the integrator output signal to an appropriate voltage. Further, transistors 235 and 240 limit integrator swing and lack flexibility.

Figure 3:
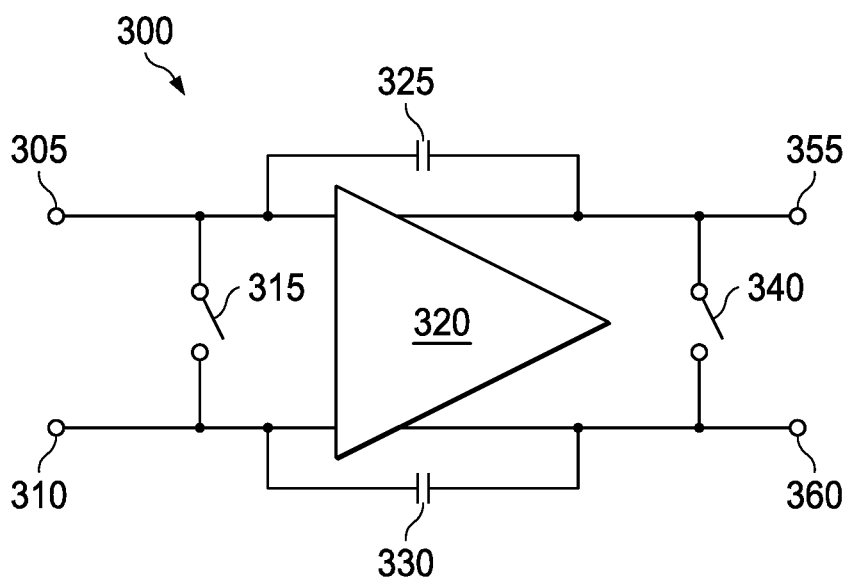
FIG. 3 illustrates another example integrator stage which resets the integrator output signal in response to outputting a predetermined threshold number of consecutive ones or zeros for use in a delta sigma modulator circuit.

FIG. 3 illustrates another example integrator stage 300 which resets the integrator output signal in response to outputting a predetermined threshold number of consecutive ones or zeros for use in a delta sigma modulator circuit. Integrator stage 300 includes an integrator 320 with inputs 305 and 310 and outputs 355 and 360. Capacitor 325 is coupled between input 305 and output 355, and capacitor 330 is coupled between input 310 and output 360. A first restore switch 315 is coupled between inputs 305 and 310, and a second restore switch 340 is coupled between outputs 355 and 360. Restore switches 315 and 340 are closed in response to a predetermined threshold number of consecutive ones or zeros. The predetermined threshold number is chosen to indicate overload conditions. Integrator stage 300 is described more fully in U.S. Pat. No. 6,362,763, titled "Method and Apparatus for Oscillation Recovery in a Delta-Sigma A/D Converter" to Wang.

Charge is redistributed between capacitors 325 and 330 to remove the differential voltage between the inputs and between the outputs of the integrator 320, which resets the integrator output signal to zero. However, resetting the integrator output signal is disruptive and makes the output signal unusable while the integrator stage 300 is reset. Further, phase reversal can occur in some overload conditions, and other recovery measures such as a jamming digital filter may be necessary in addition to integrator stage 300 to reset the delta sigma modulator circuit. Jamming digital filters for handling phase reversal are described more fully in U.S. Pat. No. 6,765,520, titled "Method and Circuit for Jamming Digital Filter while Resetting Delta Sigma Modulator" to Chuang, et al.

Figure 4:
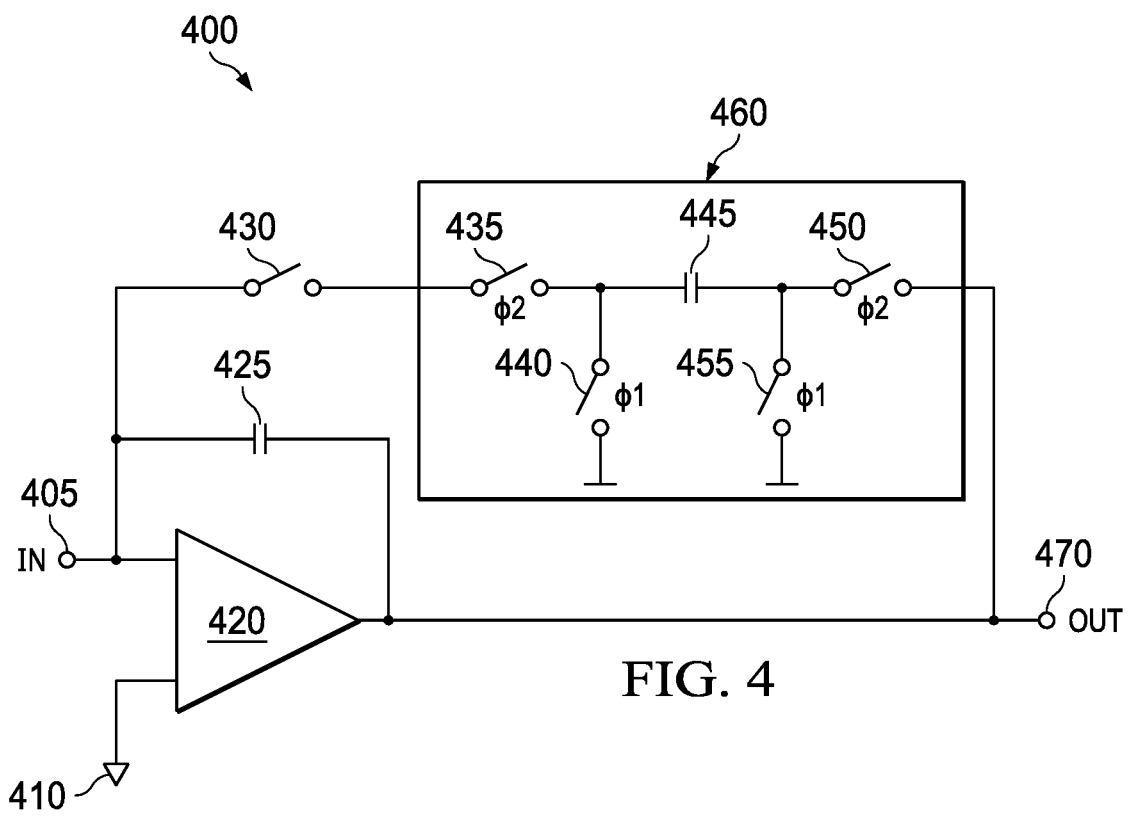
FIG. 4 illustrates another example integrator stage which adds a switched capacitor branch to the integrator to limit gain in response to detecting an overload condition for use in a delta sigma modulator circuit.

FIG. 4 illustrates another example integrator stage 400 which adds a switched capacitor branch to the integrator to limit gain in response to detecting an overload condition for use in a delta sigma modulator circuit. Integrator stage 400 includes integrator 420 with an input for input signal IN 405 and an output for output signal OUT 470. A second input of integrator 420 is coupled to a common mode voltage in this example, but in other implementations can be coupled to a reference voltage. Capacitor 425 is coupled between the input for IN 405 and the output for OUT 470. Switch 430 and circuit 460 are coupled in parallel with capacitor 425 between the input for IN 405 and the output for OUT 470. Circuit 460 introduces a switched capacitor impedance to integrator 420, reducing the integrator gain by converting the integrator into a low pass filter.

Circuit 460 includes capacitor 445 and switches 435, 440, 445, and 450. Switches 440 and 455 are closed during a first clock cycle, noted as φ1, to charge capacitor 435. During a second clock cycle, noted as φ2, switches 435 and 450 are closed to couple the charged capacitor 445 to the input for IN 405. In the absence of overload conditions, switch 430 is open such that the integrator 420 acts as an integrator. In response to detecting overload conditions, an overload detection circuit causes switch 430 to close, and integrator 420 acts as a low pass filter. However, integrator stage 400 requires additional switched capacitor branches, which increase the area on the semiconductor die including integrator stage 400. Integrator stage 400 is described more fully in U.S. Pat. No. 6,061,009, titled "Apparatus and Method for Resetting Delta-Sigma Modulator State Variables Using Feedback Impedance" to Krone, et al.

Figure 5:
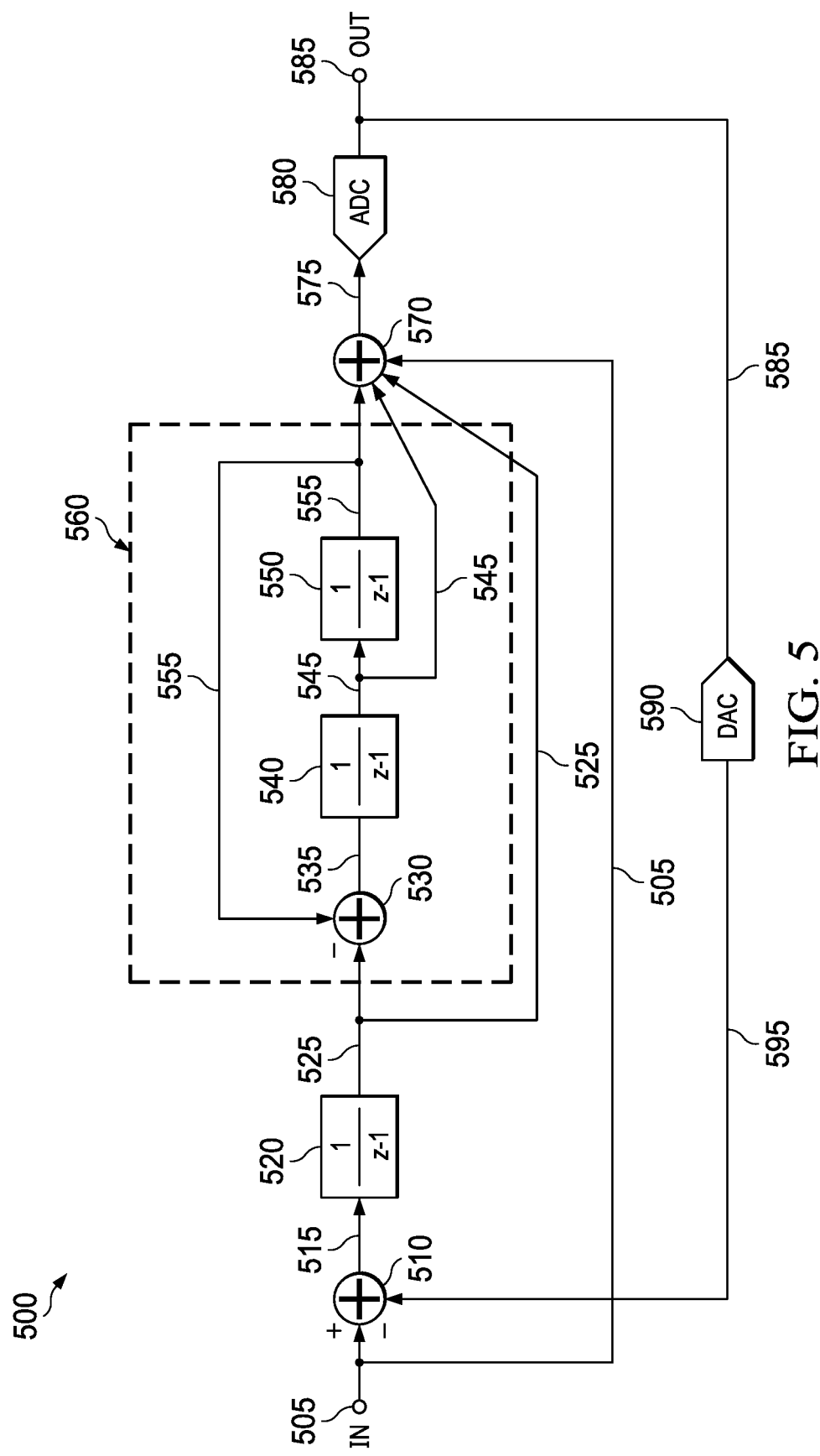
FIG. 5 illustrates a block diagram of an example higher order delta sigma modulator with a local resonator for improved signal to noise ratio.

FIG. 5 illustrates a block diagram of an example higher order delta sigma modulator 500 with a local resonator 560 for improved signal to noise ratio. The delta sigma modulator 500 is similar to the delta sigma modulator 100 shown in FIG. 1, but includes an additional adder among the integrator stages 520, 540, and 550. Local resonator 560 includes adder 530 and integrators 540 and 550. An input signal IN 505 is input to integrator 520 through adder 510 and to adder 570. The output 525 of integrator 520 is input to integrator 540 through adder 530 and to adder 570. The output 545 of integrator 540 is provided to adder 570 and integrator 550. The output 555 of integrator 550 is provided to adder 570 and to adder 530.

Adder 530 combines the output signal 525 from an additive input and the output signal 555 from a subtractive input together to obtain the summed signal 535, which is input to integrator 540 in a local feedback loop. Adder 570 adds the output signals 505, 525, 545, and 555 together to obtain the summed signal 575. The ADC 580 converts the analog summed signal 575 into a digital output signal OUT 585, which is provided to other circuits for use and to DAC 590. DAC 590 converts the digital signal OUT 585 into an analog output signal 595, which is provided to adder 510 in a feedback loop for subtraction from IN 505. Local resonator 560 reduces in bound quantization noise and improves the signal to noise ratio of delta sigma modulator 500. The delta sigma modulator 500 is a third order modulator, but additional local resonators similar to local resonator 560 may be included to expand the delta sigma modulator into higher orders. For example, a second local resonator may be added to adapt delta sigma modulator 500 into a fifth order modulator.

Figure 6A:
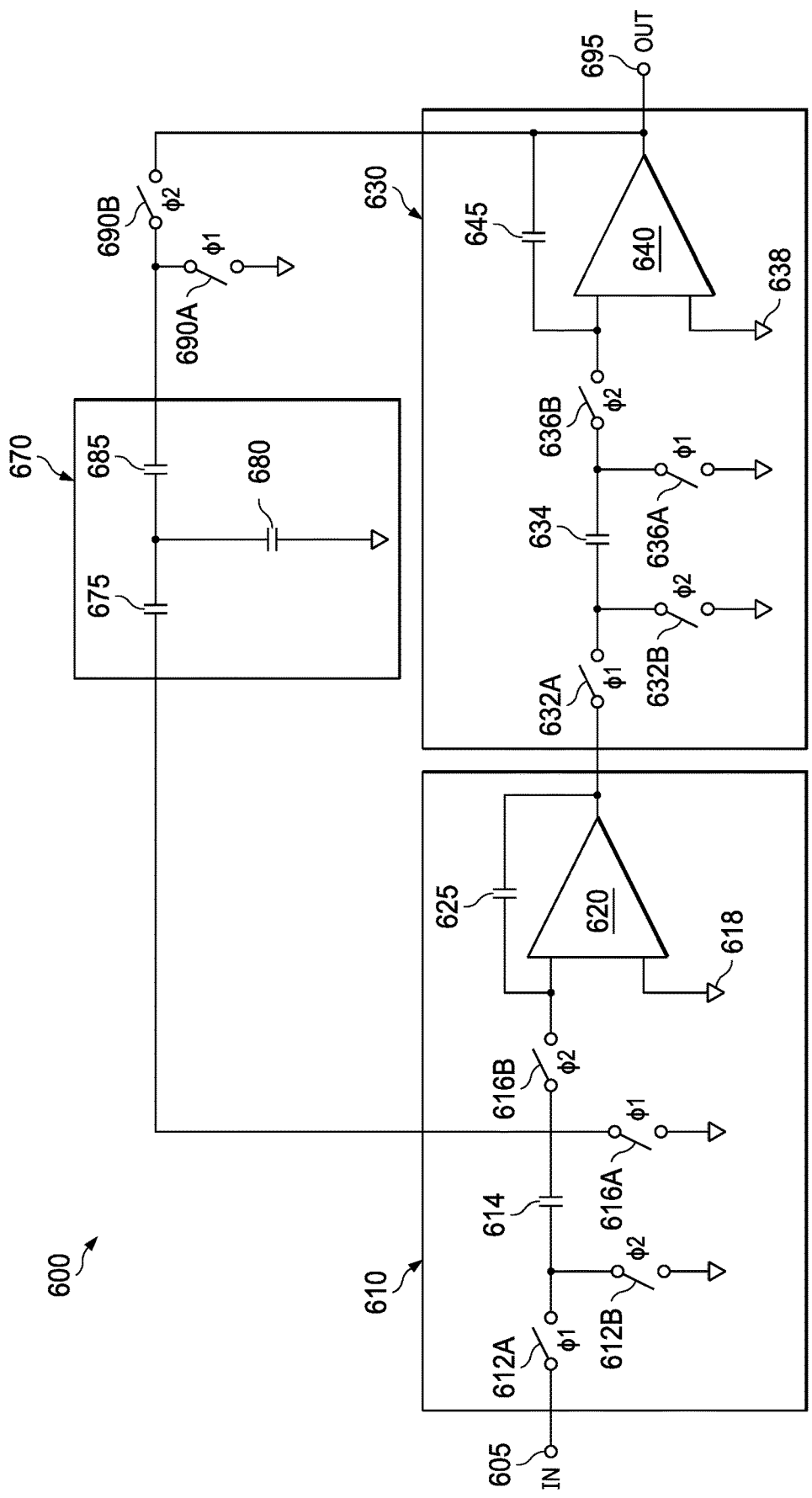
FIGS. 6A-C illustrate an example implementation of a reconfigurable local resonator for use in a higher order delta sigma modulator.
Figure 6B:
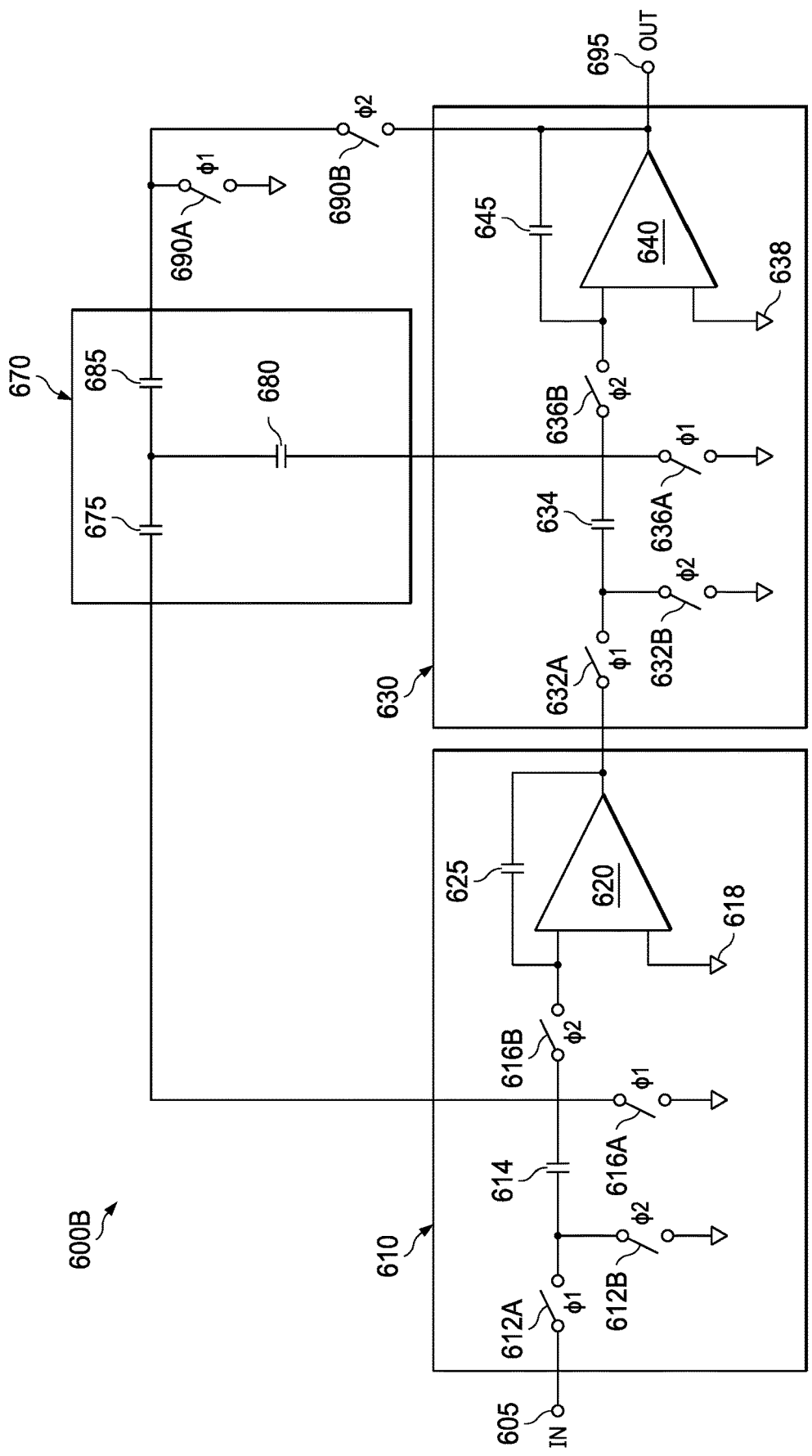
Figure 6C:
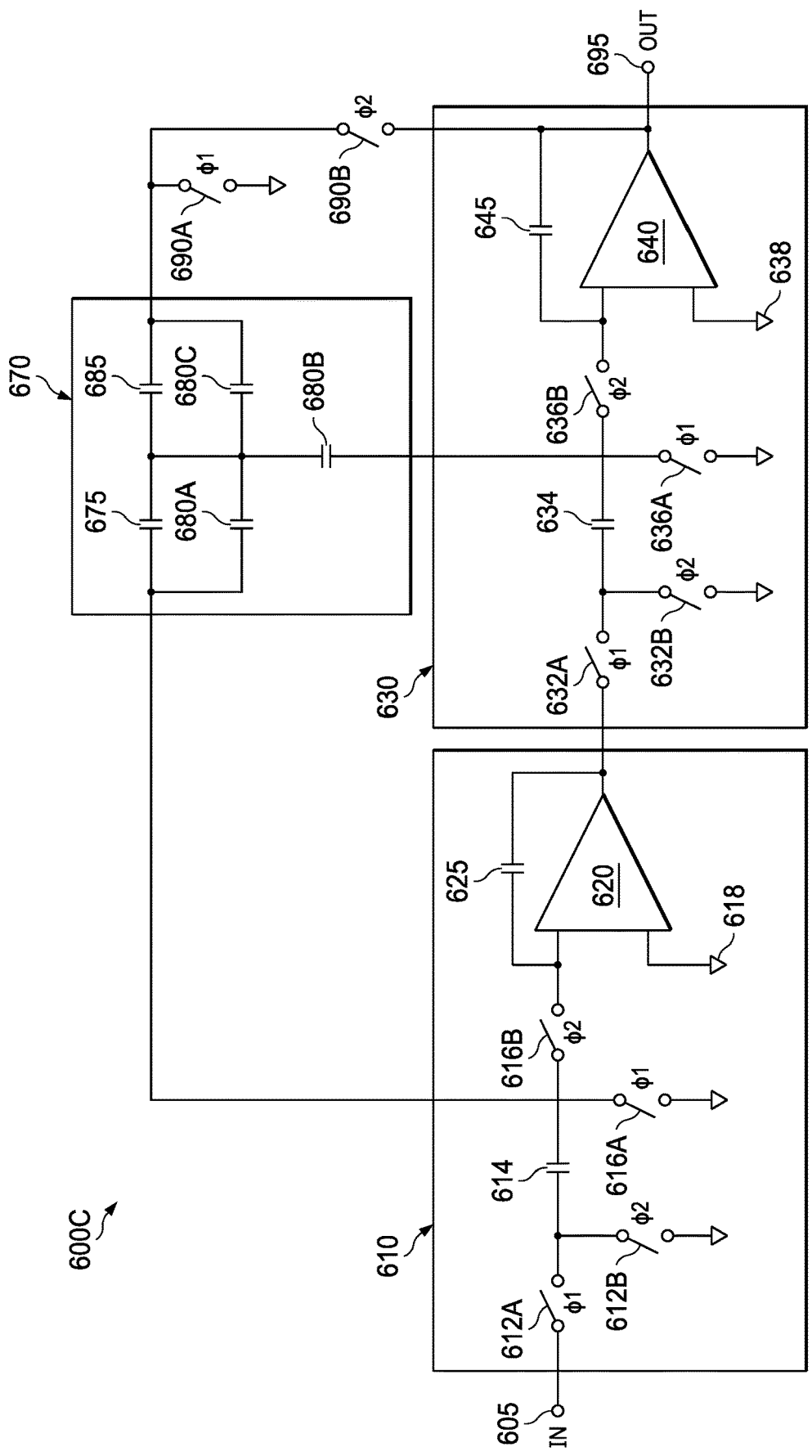

FIGS. 6A-C illustrate example implementations of a local resonator 600 for use in a delta sigma modulator which can be reconfigured in response to detecting overload conditions. Multiple reconfigurable resonators may be included in a single delta sigma modulator to achieve a desired order for the delta sigma modulator. FIG. 6A illustrates local resonator 600 configured for operation of a delta sigma modulator. Local resonator 600 includes switched capacitor type integrator stages 610 and 630 and T-shaped cell 670. Integrator stage 610 includes a switched capacitor network of switches 612A, 612B, 616A, and 616B, and capacitor 614 at the input of integrator 620. The switching of capacitor 614 is provided by switches 612A, 612B, 616A, and 616B. Switches 612A and 616A are closed during a first clock pulse, noted as $\phi 1$, to charge capacitor 614. During a second clock cycle, noted as $\phi 2$, switches 612B and 616B are closed to couple the charged capacitor 614 to the input for input signal IN 605 at integrator 620. Capacitor 625 is coupled between the input for IN 605 and the output of integrator 620. Integrator stage 630 is similar to integrator stage 610.

T-shaped cell 670 is coupled between capacitor 614 in integrator stage 610 and the output for output signal OUT 695 at integrator 640 in integrator stage 630. A T-shaped cell of capacitors comprises, for example, three capacitors. One terminal of each of the three capacitors are coupled together at a shared node. The other terminal of each capacitor is coupled to another portion of the circuit. T-shaped cell 670 includes capacitors 675, 685, and 680 configured in a T shape. The capacitances C of capacitors 675 and 685 are substantially the same, and the capacitance of capacitor 680 is a multiple N of the capacitance C of capacitors 675 and 685. In some examples, capacitor 680 is a single, larger capacitor, while in other examples, capacitor 680 is several smaller capacitors coupled in parallel. Switch 690A is closed during $\phi 1$, and switch 690B is closed during $\phi 2$, coupling T-shaped cell 670 to the output of integrator 640 for OUT 695. During operation of a delta sigma modulator including local resonator 600, T-shaped cell 670 acts as a resonator feedback loop with an equivalent feedback capacitance of approximately $1/[(2+N)(C)]$, which reduces in bound quantization noise and improves the signal to noise ratio of the delta sigma modulator.

In response to detecting overload conditions, local resonator 600 is reconfigured into a low pass filter. FIG. 6B shows an example reconfiguration 600B of local resonator 600 in which integrator stages 610 and 630 remain unchanged, but capacitor 680 in T-shaped cell 670 is coupled to the input for integrator 640. Local resonator 600B is a biquadratic low pass filter which limits gain applied to IN 605 across integrator stages 610 and 630. In some implementations, the capacitance of capacitor 680 is maintained at N times the capacitance C of capacitors 675 and 685. In other implementations, the capacitance of capacitor 680 is reduced to some portion of N times C.

FIG. 6C shows an example reconfiguration 600C of local resonator 600 in which capacitor 680 comprises three capacitors 680A, 680B, and 680C. Capacitors 680A, 680B, and 680C are coupled together in parallel during operation as a local resonator 600 for a delta sigma modulator, but are uncoupled in response to overload conditions and reconfiguration 600C into a low pass filter. Capacitor 680B is coupled to the input for integrator 640, similar to reconfiguration 600B shown in FIG. 6B. Capacitor 680A is coupled in parallel with capacitor 675, and capacitor 680C is coupled in parallel with capacitor 685. The relative capacitances of capacitors 680A, 680B, and 680C can be chosen based on the desired behavior for the biquadratic low pass filter.

In both reconfigurations 600B and 600C, local resonator 600 is largely process and temperature independent, making it more reliable than integrator stage 200 shown in FIG. 2. Further, local resonator 600 does not experience a hard reset like integrator stage 300 shown in FIG. 3, such that OUT 695 is still usable by other circuits. OUT 695 can have a lower signal to noise ratio due to the decrease in gain in local resonator 600 because of the reconfiguration of T-shaped cell 670. The advantages of local resonator 600 can be achieved with just a few added switching, making it a lower cost alternative to integrator stage 400 shown in FIG. 4. Multiple local resonators similar to local resonator 600 can be included in a single delta sigma modulator to achieve higher orders, such as a single local resonator for a third order modulator, two local resonators for a fifth order modulator, and the like.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A delta sigma modulator, comprising:
a first adder;
an integrator stage coupled to an output of the first adder;
a reconfigurable local resonator coupled to an output of the integrator stage;
a second adder coupled the output of the integrator stage and an output of the reconfigurable local resonator;
an analog-to-digital converter (ADC) coupled to an output of the second adder; and a digital-to-analog converter (DAC) coupled to an output of the ADC and to a subtractive input of the first adder;
wherein the reconfigurable local resonator is configured to operate as a local resonator in response to an absence of overload conditions and to operate as a low pass filter in response to overload conditions.

2. The delta sigma modulator of claim 1, wherein the reconfigurable local resonator is a first reconfigurable local resonator, the modulator further comprising a second reconfigurable local resonator configured to operate as a second local resonator in response to the absence of overload conditions and to operate as a second low pass filter in response to overload conditions.

3. A delta sigma modulator, comprising:
a first adder;
an integrator stage coupled to an output of the first adder;
a reconfigurable local resonator coupled to an output of the integrator stage;
a second adder coupled the output of the integrator stage and an output of the reconfigurable local resonator;
an analog-to-digital converter (ADC) coupled to an output of the second adder; and
a digital-to-analog converter (DAC) coupled to an output of the ADC and to a subtractive input of the first adder;

wherein the integrator stage is a first integrator stage, and wherein the reconfigurable local resonator comprises:
a third adder coupled to the output of the first integrator stage;
a second integrator stage coupled to an output of the third adder; and
a third integrator stage coupled to an output of the second integrator stage, wherein the second adder is further coupled to the input of the second integrator stage and to an output of the third integrator stage, and wherein the third adder is further coupled to the output of the third integrator stage.

4. A delta sigma modulator, comprising:
a first adder;
an integrator stage coupled to an output of the first adder;
a reconfigurable local resonator coupled to an output of the integrator stage;
a second adder coupled the output of the integrator stage and an output of the reconfigurable local resonator;
an analog-to-digital converter (ADC) coupled to an output of the second adder; and
a digital-to-analog converter (DAC) coupled to an output of the ADC and to a subtractive input of the first adder;
wherein the integrator stage comprises:
a switched capacitor network coupled to the output of the first adder;
an integrator comprising:
an input coupled to an output of the switched capacitor network, and
an integrator output comprising the output of the integrator stage; and
a capacitor coupled to the input and the integrator output.

5. The delta sigma modulator of claim 4, wherein the capacitor comprises a first capacitor, and wherein the switched capacitor network comprises:
a second capacitor;
a first switch coupled between the output of the first adder and the second capacitor;
a second switch coupled to the first switch and the second capacitor and further coupled to a reference voltage;
a third switch coupled between the second capacitor and the input; and
a fourth switch coupled to the third switch and the second capacitor and further coupled to the reference voltage, wherein:
on a first clock cycle, the first and fourth switches are closed and the second and third switches are open, and
on a second clock cycle, the first and fourth switches are open and the second and third switches are closed.

6. A reconfigurable local resonator, comprising:
an adder;
a first integrator stage coupled to an output of the adder;
a second integrator stage coupled to an output of the first integrator stage;
a T-shaped cell of capacitors comprising:
a first capacitor coupled to an input of the first integrator stage;
a second capacitor coupled to the first capacitor; and
a third capacitor coupled to the first and second capacitors; and
a switching stage coupled to the second capacitor and to an output of the second integrator stage, wherein the output of the second integrator stage is further coupled to a subtractive input of the adder.

7. The resonator of claim 6, wherein the first integrator stage comprises:
a switched capacitor network; and
an integrator having an input coupled to an output of the switched capacitor network and a fourth capacitor and having the output of the first integrator stage, wherein the first capacitor is coupled to the input of the integrator.

8. The resonator of claim 6, wherein the second integrator stage comprises:
a switched capacitor network; and
an integrator having an input coupled to an output of the switched capacitor network and a fourth capacitor and having the output of the second integrator stage.

9. The resonator of claim 8, wherein the third capacitor is configured to be coupled to the input of the integrator in response to a control signal.

10. The resonator of claim 8, wherein the third capacitor comprises a fifth capacitor, a sixth capacitor, and a seventh capacitor coupled together in parallel in response to an absence of overload operating conditions, wherein in response to a control signal:
the fifth capacitor is coupled in parallel with the first capacitor;
the sixth capacitor is coupled in parallel with the second capacitor; and
the seventh capacitor is coupled to the input of the integrator.

11. The resonator of claim 8, wherein the adder comprises a first adder, and wherein the resonator is included in a delta sigma modulator further comprising:
a second adder;
a third integrator stage coupled to an output of the second adder, wherein the first adder is coupled to an output of the third integrator stage;
a third adder coupled to the output of the second integrator stage, the output of the first integrator stage, and the output of the third integrator stage;
an analog-to-digital converter (ADC) coupled to an output of the third adder; and
a digital-to-analog converter (DAC) coupled to an output of the ADC, wherein an output of the DAC is coupled to a subtractive input of the second adder.

12. A delta sigma modulator, comprising:
a first adder configured to receive an input signal at an additive input;
an integrator stage configured to receive an output from the first adder and generate an integrated signal;
a reconfigurable local resonator configured to receive the integrated signal and generate a resonator output signal;
a second adder configured to receive the resonator output signal, the integrated signal, and the input signal;
an analog-to-digital converter (ADC) configured to receive an output from the second adder and generate an output signal; and
a digital-to-analog converter (DAC) configured to receive the output signal and generate a feedback signal, wherein the first adder is further configured to receive the feedback signal at a subtractive input;
wherein the integrator stage comprises a first integrator stage, and wherein the reconfigurable local resonator comprises:
a third adder configured to receive the integrated signal;
a second integrator stage configured to receive an output from the third adder and generate a second integrated signal, wherein the second adder is further configured to receive the second integrated signal; and a third integrator stage configured to receive the second integrated signal and generate a third integrated signal, wherein the resonator output signal comprises the third integrated signal, and wherein the third adder is further configured to receive the resonator output signal at a subtractive input.

13. A delta sigma modulator, comprising:
a first adder configured to receive an input signal at an additive input;
an integrator stage configured to receive an output from the first adder and generate an integrated signal;
a reconfigurable local resonator configured to receive the integrated signal and generate a resonator output signal;
a second adder configured to receive the resonator output signal, the integrated signal, and the input signal;
an analog-to-digital converter (ADC) configured to receive an output from the second adder and generate an output signal; and
a digital-to-analog converter (DAC) configured to receive the output signal and generate a feedback signal, wherein the first adder is further configured to receive the feedback signal at a subtractive input;
wherein the integrator stage comprises a first integrator stage, and wherein the reconfigurable local resonator comprises:
a second integrator stage;
a third integrator stage coupled to an output of the second integrator stage;
a T-shaped cell of capacitors comprising:
a first capacitor coupled to an input of the second integrator stage;
a second capacitor coupled to the first capacitor; and
a third capacitor coupled to the first and second capacitors; and
a switching stage coupled to the second capacitor and to an output of the third integrator stage, wherein the resonator output signal comprises an output of the third integrator stage.

14. The delta sigma modulator of claim 13, wherein the second integrator stage comprises:
a switched capacitor network configured to receive the integrated signal; and
an integrator comprising:
an input coupled to an output of the switched capacitor network, and
an integrator output configured to generate an output for the second integrator stage; and
a fourth capacitor coupled to the input and the integrator output, wherein the first capacitor is further coupled to the switched capacitor network.

15. The delta sigma modulator of claim 14, wherein the switched capacitor network comprises:
a fifth capacitor;
a first switch coupled to the fifth capacitor;
a second switch coupled to the first switch and the fifth capacitor and further coupled to a reference voltage;
a third switch coupled between the fifth capacitor and the input; and
a fourth switch coupled to the third switch and the fifth capacitor and further coupled to the reference voltage, wherein:
on a first clock cycle, the first and fourth switches are closed and the second and third switches are open, and
on a second clock cycle, the first and fourth switches are open and the second and third switches are closed.

16. The delta sigma modulator of claim 14, wherein the third integrator stage comprises:
a second switched capacitor network configured to receive the output for the second integrator stage; and
a second integrator comprising:
an input coupled to an output of the second switched capacitor network, and
a second integrator output configured to generate an output for the third integrator stage; and
a fifth capacitor coupled to the input and the integrator output, wherein the second capacitor is further coupled to the second integrator output.

17. The delta sigma modulator of claim 16, wherein the second switched capacitor network comprises:
a fifth capacitor;
a first switch coupled to the fifth capacitor;
a second switch coupled to the first switch and the fifth capacitor and further coupled to a reference voltage;
a third switch coupled between the fifth capacitor and the input; and
a fourth switch coupled to the third switch and the fifth capacitor and further coupled to the reference voltage, wherein:
on a first clock cycle, the first and fourth switches are closed and the second and third switches are open, and
on a second clock cycle, the first and fourth switches are open and the second and third switches are closed.

18. The delta sigma modulator of claim 16, wherein the third capacitor is configured to be coupled to a reference voltage in response to an absence of overload operating conditions for the delta sigma modulator and coupled to the second switched capacitor network in response to overload operating conditions for the delta sigma modulator.

19. The delta sigma modulator of claim 16, wherein the third capacitor comprises a sixth capacitor, a seventh capacitor, and an eighth capacitor, wherein the sixth, seventh, and eighth capacitors are coupled together in parallel and to a reference voltage in response to an absence of overload operating conditions for the delta sigma modulator, and wherein the sixth capacitor is coupled to the second switched capacitor network in response to overload operating conditions for the delta sigma modulator.

20. The delta sigma modulator of claim 19, wherein the seventh capacitor is coupled in parallel with the first capacitor in response to overload operating conditions for the delta sigma modulator, and wherein the eighth capacitor is coupled in parallel with the second capacitor in response to overload operating conditions for the delta sigma modulator.

* * * * *